United States Patent
Rudeck

(10) Patent No.: US 6,657,250 B1
(45) Date of Patent: Dec. 2, 2003

(54) VERTICAL FLASH MEMORY CELL WITH BURIED SOURCE RAIL

(75) Inventor: Paul Rudeck, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/224,702

(22) Filed: Aug. 21, 2002

(51) Int. Cl.$^7$ .................................. H01L 29/788
(52) U.S. Cl. .................................. 257/315; 257/328
(58) Field of Search ................... 257/315, 328

(56) References Cited

U.S. PATENT DOCUMENTS

| | | | |
|---|---|---|---|
| 5,071,782 A | * 12/1991 | Mori | 438/259 |
| 5,386,132 A | * 1/1995 | Wong | 257/316 |
| 5,460,988 A | * 10/1995 | Hong | 438/259 |
| 5,563,083 A | * 10/1996 | Pein | 438/259 |
| 6,091,102 A | * 7/2000 | Sekariapuram et al. | 257/316 |
| 6,157,061 A | * 12/2000 | Kawata | 257/316 |
| 6,265,292 B1 | 7/2001 | Parat et al. | |
| 6,376,312 B1 | 4/2002 | Yu | |
| 6,461,915 B1 | 10/2002 | Rudeck | |

* cited by examiner

Primary Examiner—David Nelms
Assistant Examiner—Tu-Tu Ho
(74) Attorney, Agent, or Firm—Leffert Jay & Polglaze, P.A.

(57) ABSTRACT

A non-volatile memory cell has been described that includes source and drain regions that are fabricated on different horizontal planes. A floating gate and a control gate are fabricated vertically to control current conducted through the transistor. The control gate is coupled to a word line that is located above the transistor and traverses the memory in a direction perpendicular to the control gate.

15 Claims, 6 Drawing Sheets

VERTICAL FLASH MEMORY CELL WITH BURIED SOURCE RAIL

FIELD OF THE INVENTION

The present invention relates generally to non-volatile memory cells and in particular the present invention relates to flash memory cells.

BACKGROUND OF THE INVENTION

Memory devices are available in a variety of styles and sizes. Some memory devices are volatile in nature and cannot retain data without an active power supply. A typical volatile memory is a DRAM which includes memory cells formed as capacitors. A charge, or lack of charge, on the capacitors indicate a binary state of data stored in the memory cell. Dynamic memory devices require more effort to retain data than non-volatile memories, but are typically faster to read and write.

Non-volatile memory devices are also available in different configurations. For example, floating gate memory devices are non-volatile memories that use floating gate transistors to store data. The data is written to the memory cells by changing a threshold voltage of the transistor and is retained when the power is removed. The transistors can be erased to restore the threshold voltage of the transistor. The memory may be arranged in erase blocks where all of the memory cells in an erase block are erased at one time. These non-volatile memory devices are commonly referred to as flash memories.

The non-volatile memory cells are fabricated as floating gate memory cells and include a source region and a drain region that is laterally spaced apart from the source region to form an intermediate channel region. The source and drain regions are formed in a common horizontal plane of a silicon substrate. A floating gate, typically made of doped polysilicon, is disposed over the channel region and is electrically isolated from the other cell elements by oxide. For example, gate oxide can be formed between the floating gate and the channel region. A control gate is located over the floating gate and is can also made of doped polysilicon. The control gate is electrically separated from the floating gate by another dielectric layer. Thus, the floating gate is "floating" in dielectric so that it is insulated from both the channel and the control gate.

As semiconductor devices get smaller in size, designers are faced with problems associated with the production of memory cells that consume a small enough amount of surface area to meet design criteria, yet maintain sufficient performance in spite of this smaller size.

For the reasons stated above, and for other reasons stated below which will become apparent to those skilled in the art upon reading and understanding the present specification, there is a need in the art for an improved non-volatile memory cell.

SUMMARY OF THE INVENTION

The above-mentioned problems with non-volatile memory cells and other problems are addressed by the present invention and will be understood by reading and studying the following specification.

In one embodiment, a memory cell comprises a substrate, source and drain regions located in the substrate and vertically spaced apart to define a vertical channel region, a floating gate located horizontally adjacent the channel region, and a vertically extending control gate located adjacent to the floating gate.

In another embodiment, a non-volatile memory cell comprises a substrate, source and drain regions located in the substrate and vertically spaced apart to define a vertical channel region, a floating gate located horizontally adjacent the channel region, a control gate located adjacent to the floating gate and extending in Y and Z directions, and a word line coupled to the control gate, wherein the word line extends in an X direction perpendicular to the control gate.

A method of fabricating a floating gate transistor comprises fabricating first and second laterally spaced trenches in a substrate, such that a vertically extending substrate island is formed. A source region is implanted under the first and second trenches and in the substrate. The method further comprises implanting a drain region in a top region of the substrate island, fabricating a first dielectric layer adjacent to the substrate island, and fabricating a floating gate adjacent to the first dielectric layer such that the first dielectric layer is between the floating gate and the substrate island. A second dielectric layer is fabricated adjacent to the floating gate, and a control gate is fabricated adjacent to the second dielectric layer such that the second dielectric layer is between the control gate and the floating gate.

DETAILED DESCRIPTION OF THE DRAWINGS

Figure 1:
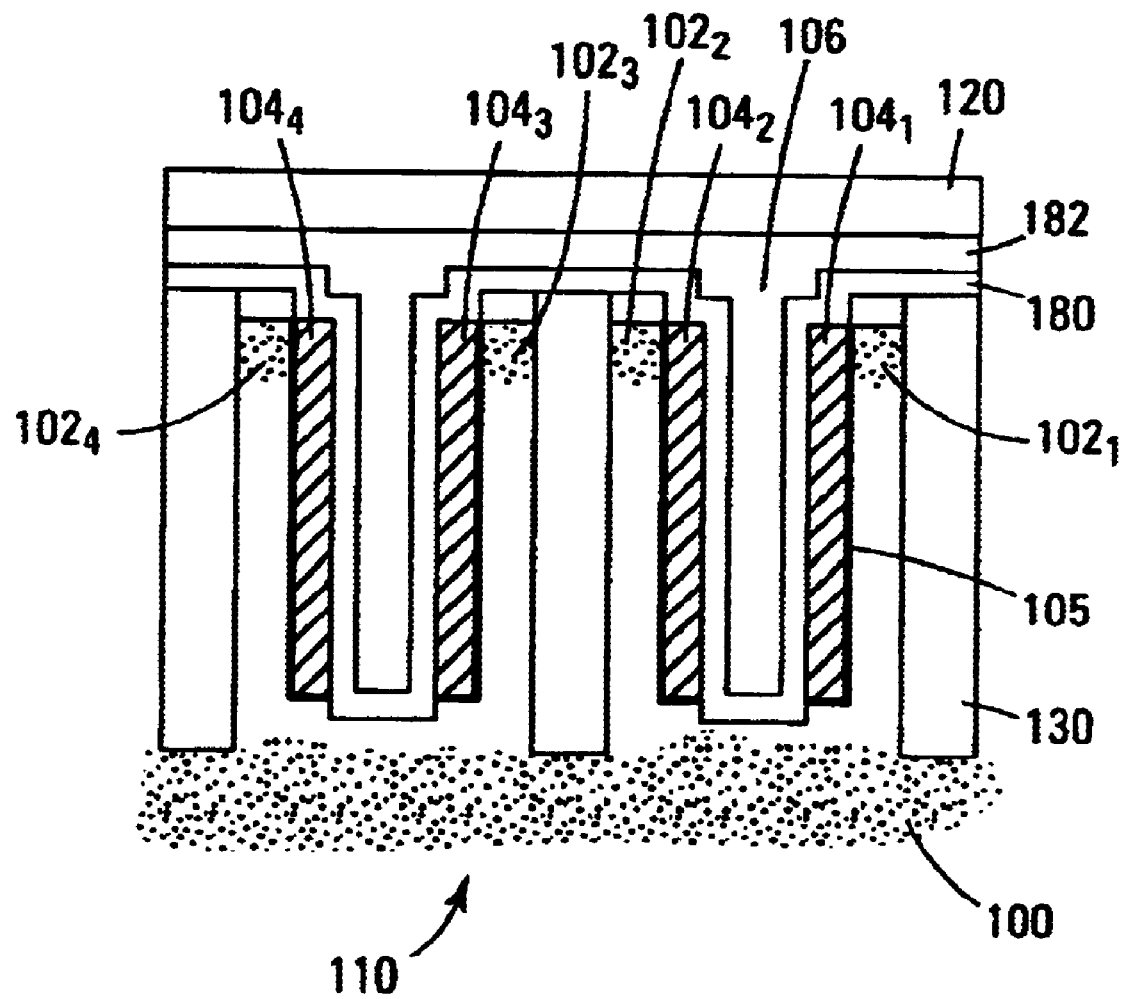
FIG. 1 is a cross-section view of a non-volatile memory cell according to one embodiment of the present invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

To aid in interpretation of the description of the illustrations and claims that follow, the term "semiconductor substrate" is defined to mean any construction comprising semiconductive material, including, but not limited to, bulk semiconductive materials such as a semiconductor wafer (either alone or in assemblies comprising other materials thereon) and semiconductive material layers (either alone or in assemblies comprising other materials). The term "substrate" refers to any supporting structure, including, but not limited to, the semiconductor substrates described above. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art.

In addition, as the structures formed by embodiments in accordance with the present invention are described herein, common semiconductor terminology such as N-type, P-type, N+ and P+ will be employed to describe the type of conductivity doping used for the various structures or regions being described. The specific levels of doping are not believed to be germane to embodiments of the present invention; thus, it will be understood that while specific dopant species and concentrations are not mentioned, an appropriate dopant species with an appropriate concentration to its purpose, is employed.

The term conductor is understood to also include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

Finally, it will be understood that the number, relative size and spacing of the structures depicted in the accompanying figures are exemplary only, and thus were selected for ease of explanation and understanding. Therefore such representations are not indicative of the actual number or relative size and spacing of an operative embodiment in accordance with the present invention.

Non-volatile memory cells, as explained above, can be formed as floating gate transistors. While the area of the transistors can be reduced, the coupling ratio between the floating gate and the control gate is also reduced. Generally, as the gate-coupling ratio between the floating gate and the control gate decreases, the work voltage necessary to operate the memory transistor increases. As a consequence, the operational speed and efficiency of the flash memory decrease tremendously.

Some methods for increasing the gate-coupling ratio include: increasing the overlapped area between the floating and the control gate, reducing the thickness of the dielectric layer between the floating gate and the control gate, and increasing the dielectric constant (k) of the dielectric layer between the floating gate and the control gate. Generally, to achieve an increase in the overlapped area between the floating and control gates and thus increase the gate-coupling ratio, the size of the floating gate has to be increased. However, this is not desirable for the demands of today's highly-integrated technologies.

Referring to FIG. 1, a cross-section view of non-volatile memory cells according to one embodiment of the present invention is provided. Each of the memory cells include a source region 100, drain region 102, floating gate 104 and a control gate 106. Unlike prior flash memory cells, the source 100 and drain 102 regions of the memory cells of the present invention are not located in a common horizontal plane of the memory device substrate. As explained below, the source and drain regions are fabricated in different planes such that a channel 105 of the memory cell transistor extends in a vertical direction. The floating gate 104 and control gate 106 also extend vertically into the substrate 110 to control the memory cell.

As shown in FIG. 1, four floating gate transistor memory cells are fabricated in trenches formed in the substrate. The transistors share a common diffused source region 100, and the drain regions $102_1$–$102_4$ are fabricated above the source region. Two adjacent transistors have independent floating gates, for example $102_1$–$102_2$, fabricated in a trench and share a common control gate 106 fabricated between the floating gates. The control gates are coupled to a word line 120 that extends perpendicularly to the length of the control gates.

Figure 2:
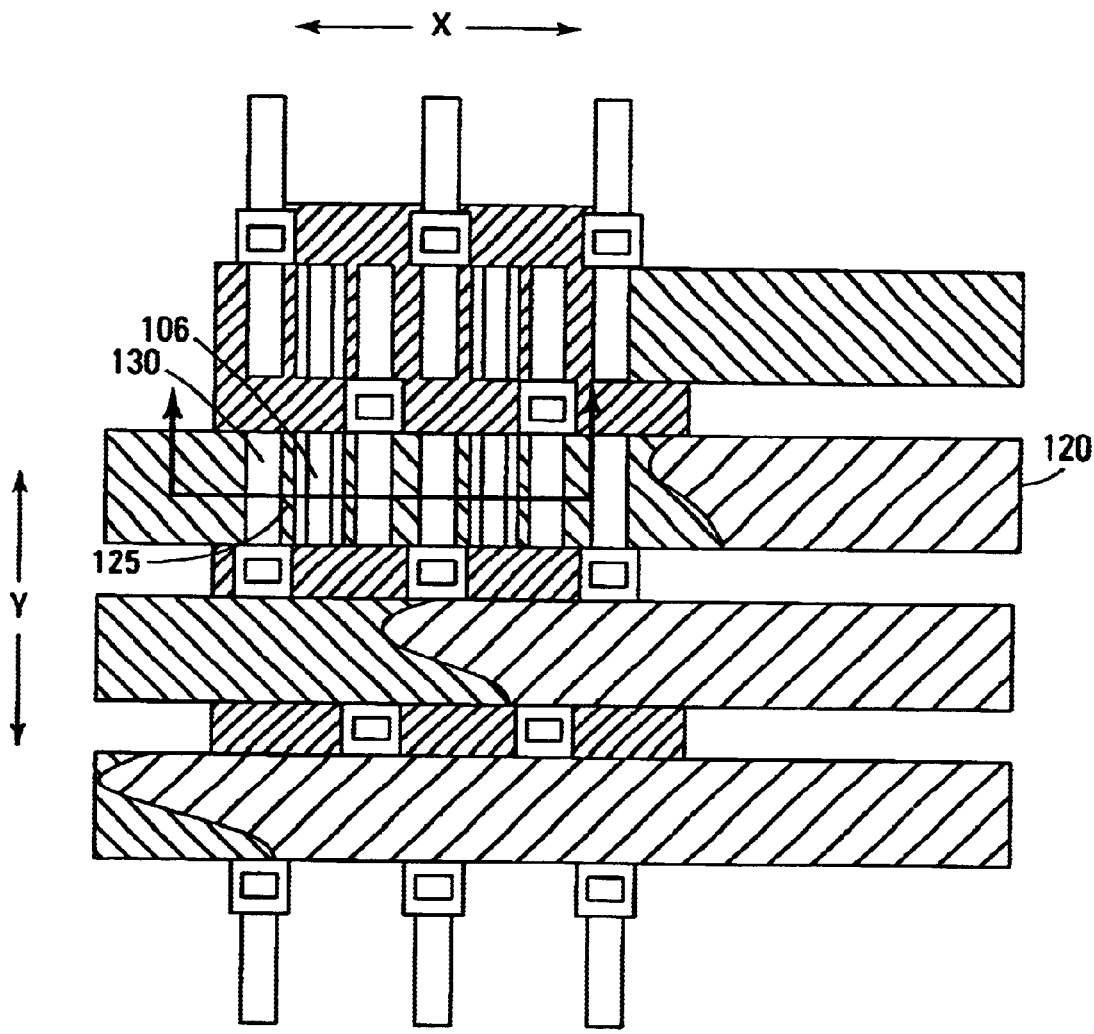
FIG. 2 is a plan view of memory cells according to one embodiment of the present invention.

A plan view of a portion of a memory cell array is illustrated in FIG. 2. The word lines 120 run in the X-direction and are coupled to numerous control gates. The substrate had been etched to form "islands" 125 that are used as the transistor drain regions 102. The floating gates 104 (not shown) and control gates 106 are formed under the word lines and between the islands. The remaining areas between and around the islands are isolated using dielectric isolation regions 130, as explained below.

The features of one embodiment of the present invention can be described in greater detail with reference to a method of fabricating the transistors. The method is described in sufficient detail to provide an understanding of one method to form transistors of the present invention. It will be understood by those skilled in the art that all process steps are not described in detail herein, and that extra steps or modifications of the steps may be needed depending upon the integrated circuit design and manufacturing equipment.

Figure 3:
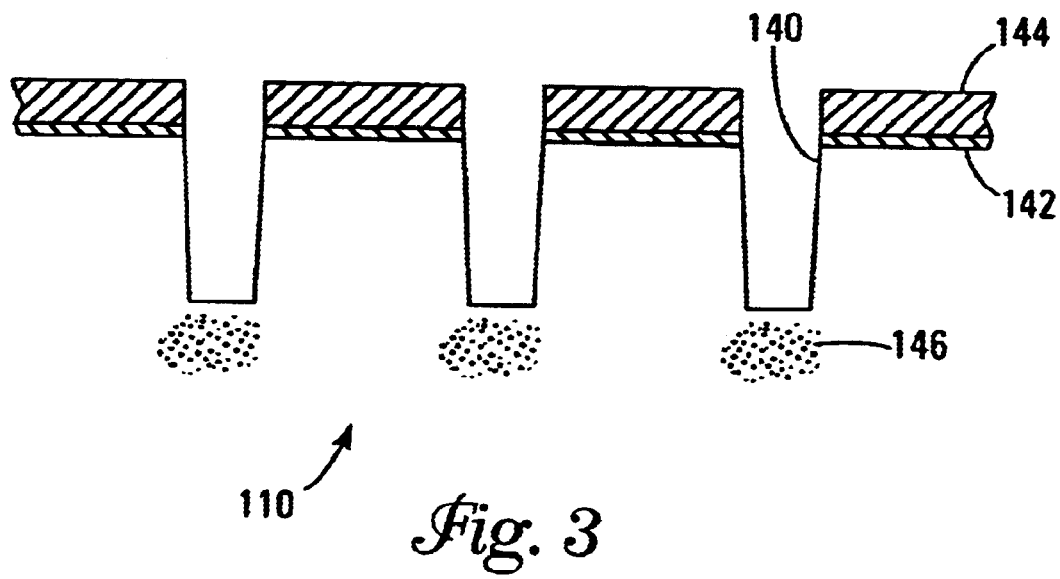
FIG. 3 is a cross-section of memory cells of FIG. 1 during fabrication.
Figure 4:
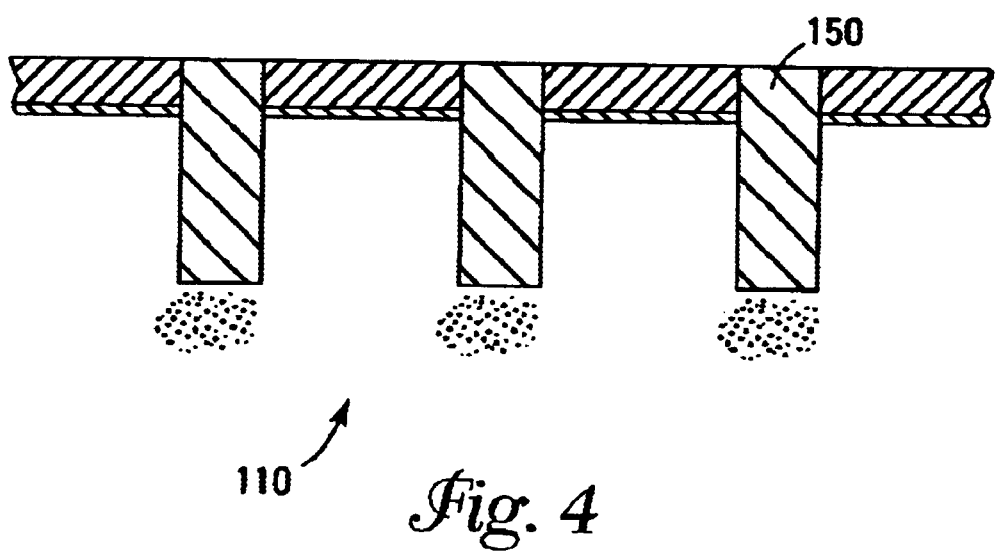
FIG. 4 is a cross-section of memory cells of FIG. 1 during fabrication.

FIG. 3 is a cross-section view of a semiconductor substrate 110 that has been patterned and etched to form shallow trenches 140. Methods of forming shallow trenches are well known in the art. The substrate has layers of oxide (SiO2) 142 and nitride (Si3N4) 144 fabricated thereon. A photolithography step is performed to define the isolation trenches. After the trenches are etched, a sacrificial layer of oxide is grown to protect the surface during a subsequent implant. An arsenic (Ars) implant is performed at one or more different energy levels to form first sections 146 of a buried source region. The sacrificial oxide is wet etched off. The trenches are then lined with a high quality thin oxide (not shown) and then filled with a dielectric material 150. The surface is then chemical mechanical planed (CMP) to the nitride, as illustrated in FIG. 4, to create the isolation regions 130 of FIG. 2.

Figure 5:
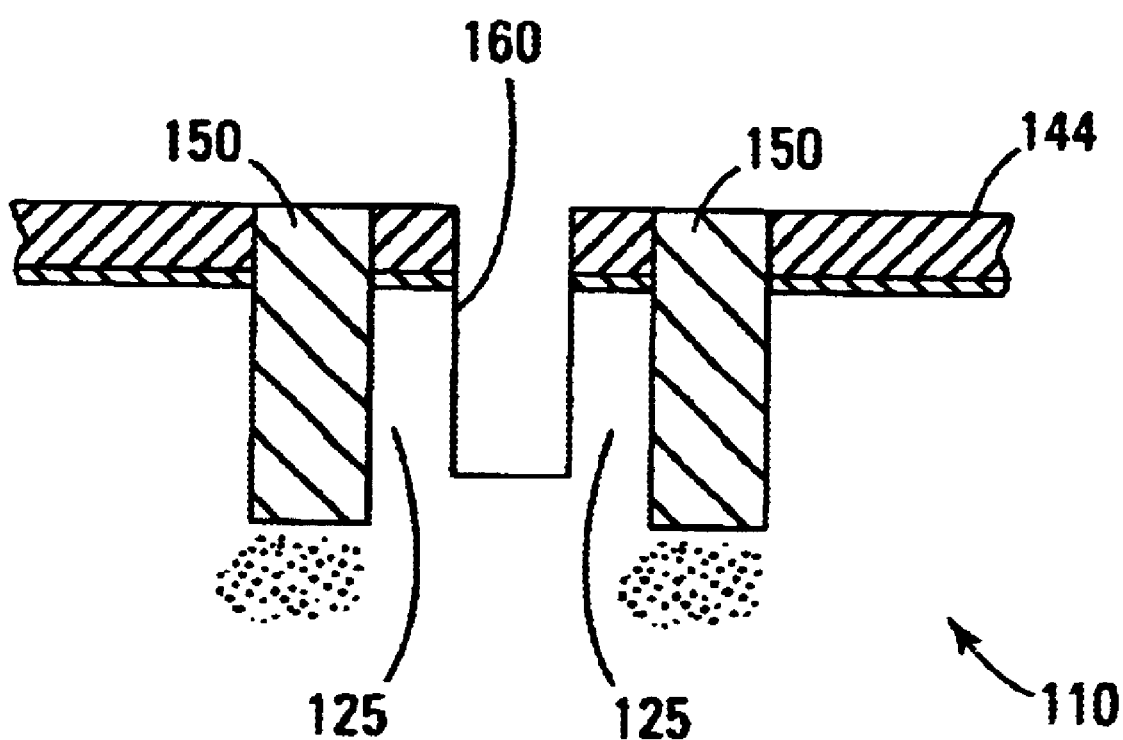
FIG. 5 is a cross-section of memory cells of FIG. 1 during fabrication.
Figure 6:
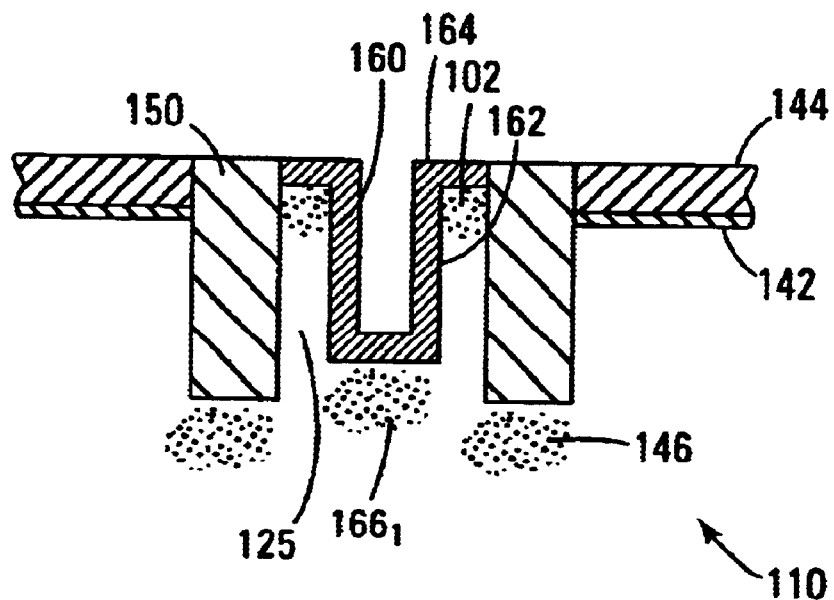
FIG. 6 is a cross-section of memory cells of FIG. 1 during fabrication.

Referring to FIGS. 5 and 6, the nitride layer 144 is masked and etched to form memory core trenches 160 between the shallow trench isolation regions 150. As a result, islands of substrate material 125 are created. A sacrificial oxide (not shown) is grown to prepare the surface for a tunnel oxide layer. As an option, an implant, at a slight angle, can be performed to provide a Vt adjust implant. The sacrificial oxide is etched off, and the tunnel oxide 162 is grown inside the memory core trenches 160. A polysilicon (poly) layer 164 is deposited and then CMPed to disconnect the top of the layer of poly. The disconnected poly will be used to form the transistor floating gates 104 (FIG. 1). The nitride layer is then removed and another arsenic implant is performed to form second sections 166, of the buried source region 100 and create the drain regions 102 of the transistors. The drains are located on the top areas of the islands 155.

Figure 7:
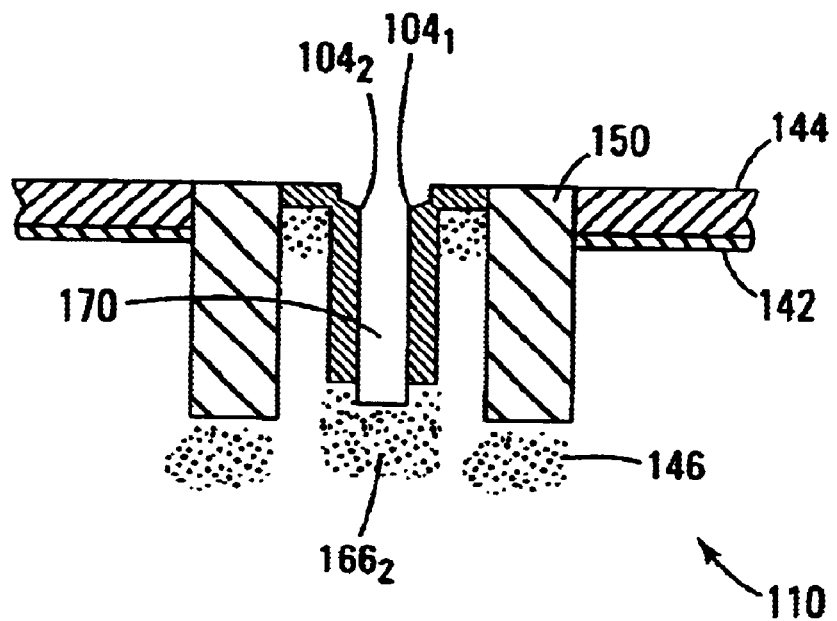
FIG. 7 is a cross-section of memory cells of FIG. 1 during fabrication.

Referring to FIG. 7, the polysilicon layer 164 is dry etched to separate the poly into floating gate structures $104_1$ and $104_2$. The tunnel oxide 162 between the floating gates is also etched to form a shallow trench 170 into the substrate 110. An additional arsenic implant $166_2$ can be performed to contribute to the source region. Referring again to FIG. 1, the source implants are diffused to form a common buried source rail 100. An oxide-nitride-oxide (ONO) layer 180 is formed to cover the floating gates 104, and a layer of poly 182 is deposited to fill the region between the floating gates. This poly layer forms the control gates 106 of the transistors. The poly can be layered with a Wsi2 layer. The Wsi2 and poly layers are etched to form word lines 120 as illustrated in the plan view of FIG. 2.

Referring to FIG. 2, drain contact regions 190 are located between the word lines 120. As such, one drain contact 190 is coupled to two drain regions 102 of transistors that have different word lines. Although not illustrated, an insulator such as boro-phospho-silicate glass (BPSG) or phospho-silicate glass (PSG) can be deposited over the word lines and drain contacts formed through the insulator layer. Bit lines (not shown) can then be formed to connect the drain contacts 190 in a direction perpendicular to the word lines. It is noted that the word lines have a major axis that runs in the X-direction in FIG. 2, while the floating gates have major axis that extend in the Y direction.

The buried source region 100 provides a common source that can be contacted periodically across the transistors. That is, a contact (not shown) is fabricated to electrically contact the source region every N transistors. The number N will depend upon numerous factors such as contact resistance, operating currents and source resistance.

Figure 8:
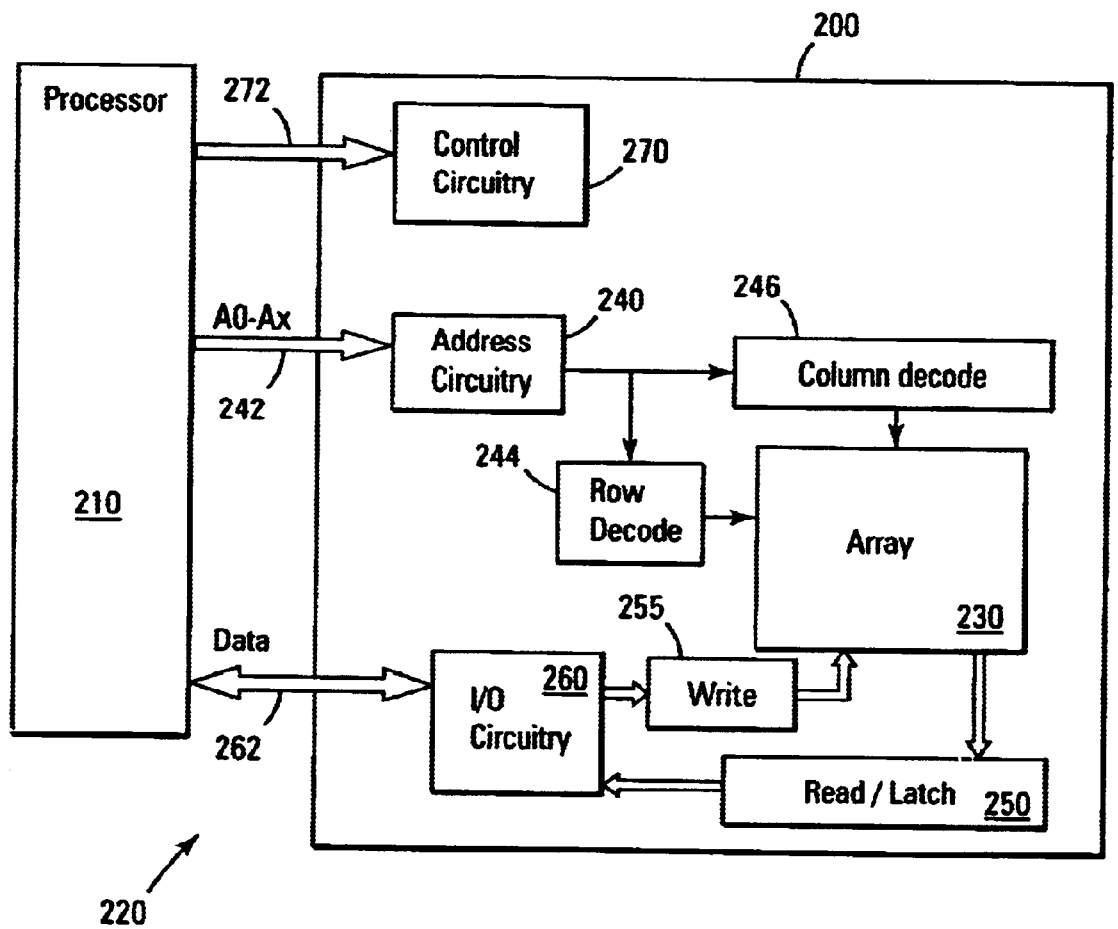
FIG. 8 is a block diagram of a memory device according to one embodiment of the present invention.

FIG. 8 is a functional block diagram of a memory device 200, of one embodiment of the present invention, which is coupled to a processor 210. The memory device 200 and the processor 210 may form part of an electronic system 220. The memory device 200 has been simplified to focus on features of the memory that are helpful in understanding the present invention. The memory device includes an array of memory cells 230. The memory cells are non-volatile floating-gate memory cells with vertical floating gates. The memory array 230 is arranged in banks of rows and columns.

An address buffer circuit 240 is provided to latch address signals provided on address input connections A0–Ax 242. Address signals are received and decoded by row decoder 244 and a column decoder 246 to access the memory array 230. It will be appreciated by those skilled in the art, with the benefit of the present description, that the number of address input connections depend upon the density and architecture of the memory array. That is, the number of addresses increases with both increased memory cell counts and increased bank and block counts.

The memory device reads data in the array 230 by sensing voltage or current changes in the memory array columns using sense/latch circuitry 250. The sense/latch circuitry, in one embodiment, is coupled to read and latch a row of data from the memory array. Data input and output buffer circuitry 260 is included for bi-directional data communication over a plurality of data (DQ) connections 262 with the processor 210. Write circuitry 255 is provided to write data to the memory array.

Command control circuit 270 decodes signals provided on control connections 272 from the processor 210. These signals are used to control the operations on the memory array 230, including data read, data write, and erase operations. The flash memory device has been simplified to facilitate a basic understanding of the features of the memory. A more detailed understanding of internal circuitry and functions of flash memories are known to those skilled in the art.

CONCLUSION

A non-volatile memory cell has been described that includes source and drain regions that are fabricated on different horizontal planes. A floating gate and a control gate are fabricated vertically to control current conducted through the transistor. The control gate is coupled to a word line that is located above the transistor and traverses the memory in a direction perpendicular to the control gate.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A memory cell comprising:
   a substrate;
   source and drain regions located in the substrate and vertically spaced apart to define a vertical channel region;
   a floating gate located horizontally adjacent the channel region;
   a vertically extending control gate located adjacent to the floating gate; and
   a vertical dielectric isolation region, comprised of a dielectric material, located horizontally adjacent the channel region and opposite to the floating gate.

2. The memory cell of claim 1 wherein the control gate is coupled to a word line, wherein the word line extends in a horizontal direction generally perpendicular to the control gate.

3. The memory cell of claim 1 wherein the control gate is shared between two adjacent memory cells.

4. The memory cell of claim 3 wherein the two adjacent memory cells share a common diffused source region.

5. A non-volatile memory cell comprising:
   a substrate;
   source and drain regions located in the substrate and vertically spaced apart to define a vertical channel region;
   a floating gate located horizontally adjacent the channel region;
   a vertical dielectric isolation region, comprising a dielectric material, located horizontally adjacent the vertical channel region and opposite to the floating gate;
   a control gate located adjacent to the floating gate and extending in Y and Z directions; and
   a word line coupled to the control gate, wherein the word line extends in an X direction perpendicular to the control gate.

6. The non-volatile memory cell of claim 5 wherein a plurality of adjacent memory cells share a common buried source line.

7. The non-volatile memory cell of claim 6 wherein the common buried source line is fabricated using a plurality of implant operations.

8. A non-volatile memory array comprising:
   a substrate;
   a first non-volatile memory cell comprising,
      a source region and a first drain regions located in the substrate and vertically spaced apart to define a first vertical channel region,
      a first floating gate located horizontally adjacent the first channel region, and
      a control gate located adjacent to the first floating gate and extending in Y and Z directions;

a second non-volatile memory cell comprising,
  the source region and a second drain region located in the substrate and vertically spaced apart to define a second vertical channel region, and
  a second floating gate located horizontally adjacent the second channel region, wherein the control gate is further located adjacent to the second floating gate such that the first and second non-volatile memory cells share the control gate;
a vertical dielectric isolation region, comprising a dielectric material, located horizontally adjacent the first and second channel regions such that it separates the first non-volatile memory cell from the second non-volatile memory cell; and
a word line coupled to the control gate, wherein the word line extends in an X direction perpendicular to the control gate.

9. The non-volatile memory array of claim 8 wherein the source region is a buried source line is fabricated using a plurality of implant operations.

10. A non-volatile memory comprising:
a substrate;
an array of non-volatile memory cells, wherein each memory cell comprises:
  source and drain regions located in the substrate and vertically spaced apart to define a vertical channel region;
  a floating gate located horizontally adjacent the channel region;
  a control gate located adjacent to the floating gate and extending in Y and Z directions;
  a vertical dielectric isolation region, comprising a dielectric material, located horizontally adjacent the vertical channel region and opposite to the floating gate;
  a word line coupled to the control gate, wherein the word line extends in an X direction perpendicular to the control gate; and
control circuitry to program and read the memory cells.

11. The non-volatile memory of claim 10 wherein a plurality of adjacent memory cells share a common buried source line.

12. The non-volatile memory of claim 11 wherein the common buried source line is fabricated using a plurality of implant operations.

13. A non-volatile memory array comprising:
a first non-volatile memory cell comprising a source region and a first drain regions vertically spaced apart to define a first vertical channel region, and a first floating gate located lateral the first channel region;
a second non-volatile memory cell comprising the source region and a second drain region vertically spaced apart to define a second vertical channel region, and a second floating gate located lateral to the second channel region;
a vertical dielectric isolation region, comprising a dielectric material, located horizontally adjacent the first and second channel regions such that it separates the first and second non-volatile memory cells;
a control gate laterally located between the first and second floating gates; and
a word line coupled to the control gate to control the first and second non-volatile memory cells.

14. The non-volatile memory array of claim 13 wherein the word line extends in a horizontal direction generally perpendicular to the control gate.

15. The non-volatile memory array of claim 13 wherein the source region is a buried source shared by the first and second non-volatile memory cells.

* * * * *